(12) United States Patent
Mojumder et al.

(10) Patent No.: US 9,812,188 B2
(45) Date of Patent: Nov. 7, 2017

(54) STATIC RANDOM-ACCESS MEMORY (SRAM) SENSOR FOR BIAS TEMPERATURE INSTABILITY

(71) Applicant: QUALCOMM Incorporated, San Diego, CA (US)

(72) Inventors: Niladri Narayan Mojumder, San Diego, CA (US); Zhongze Wang, San Diego, CA (US); Xiaonan Chen, San Diego, CA (US); Stanley Seungchul Song, San Diego, CA (US); Choh Fei Yeap, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/631,603

(22) Filed: Feb. 25, 2015

(65) Prior Publication Data
US 2016/0247554 A1 Aug. 25, 2016

(51) Int. Cl.
*G11C 11/00* (2006.01)
*G11C 11/419* (2006.01)
*G11C 7/20* (2006.01)
*G11C 11/417* (2006.01)
*G11C 29/02* (2006.01)
(Continued)

(52) U.S. Cl.
CPC .............. *G11C 11/419* (2013.01); *G11C 7/20* (2013.01); *G11C 11/417* (2013.01); *G11C 29/021* (2013.01); *G11C 29/028* (2013.01); *G11C 29/24* (2013.01); *G11C 29/50* (2013.01); *G11C 29/50004* (2013.01);
(Continued)

(58) Field of Classification Search
CPC ......... G11C 11/419; G11C 11/34; G11C 8/16; G11C 5/147; G11C 5/14; G11C 5/143; G11C 16/30; G11C 29/24; G11C 11/417; G11C 29/021; G11C 29/028; G11C 7/20; G11C 29/50; G11C 29/50004; G11C 2029/0407; G11C 2029/0409; G11C 2029/5002
USPC ........... 365/154, 156, 185.09, 226, 240, 241
See application file for complete search history.

(56) References Cited

U.S. PATENT DOCUMENTS

| 5,608,338 | A | * | 3/1997 | Maeda | .................. | G11C 29/50 |
| | | | | | | 250/310 |
| 5,715,191 | A | * | 2/1998 | Yamauchi | ............. | G11C 11/412 |
| | | | | | | 365/154 |

(Continued)

FOREIGN PATENT DOCUMENTS

JP H06326315 A 11/1994

OTHER PUBLICATIONS

Ceratti, A., et al., "On-Chip Aging Sensor to Monitor NBTI Effect in Nano-Scale SRAM," IEEE 15th International Symposium on Design and Diagnostics of Electronic Circuits & Systems (DDECS), Apr. 2012, IEEE, Piscataway, NJ, pp. 354-359.

(Continued)

*Primary Examiner* — Tha-O H Bui
(74) *Attorney, Agent, or Firm* — Qualcomm Incorporated-Toler

(57) ABSTRACT

An apparatus includes a static random-access memory and circuitry configured to initiate a corrective action associated with the static random-access memory. The corrective action may be initiated based on a number of static random-access memory cells that have a particular state responsive to a power-up of the static random-access memory.

30 Claims, 4 Drawing Sheets

Figure 1:
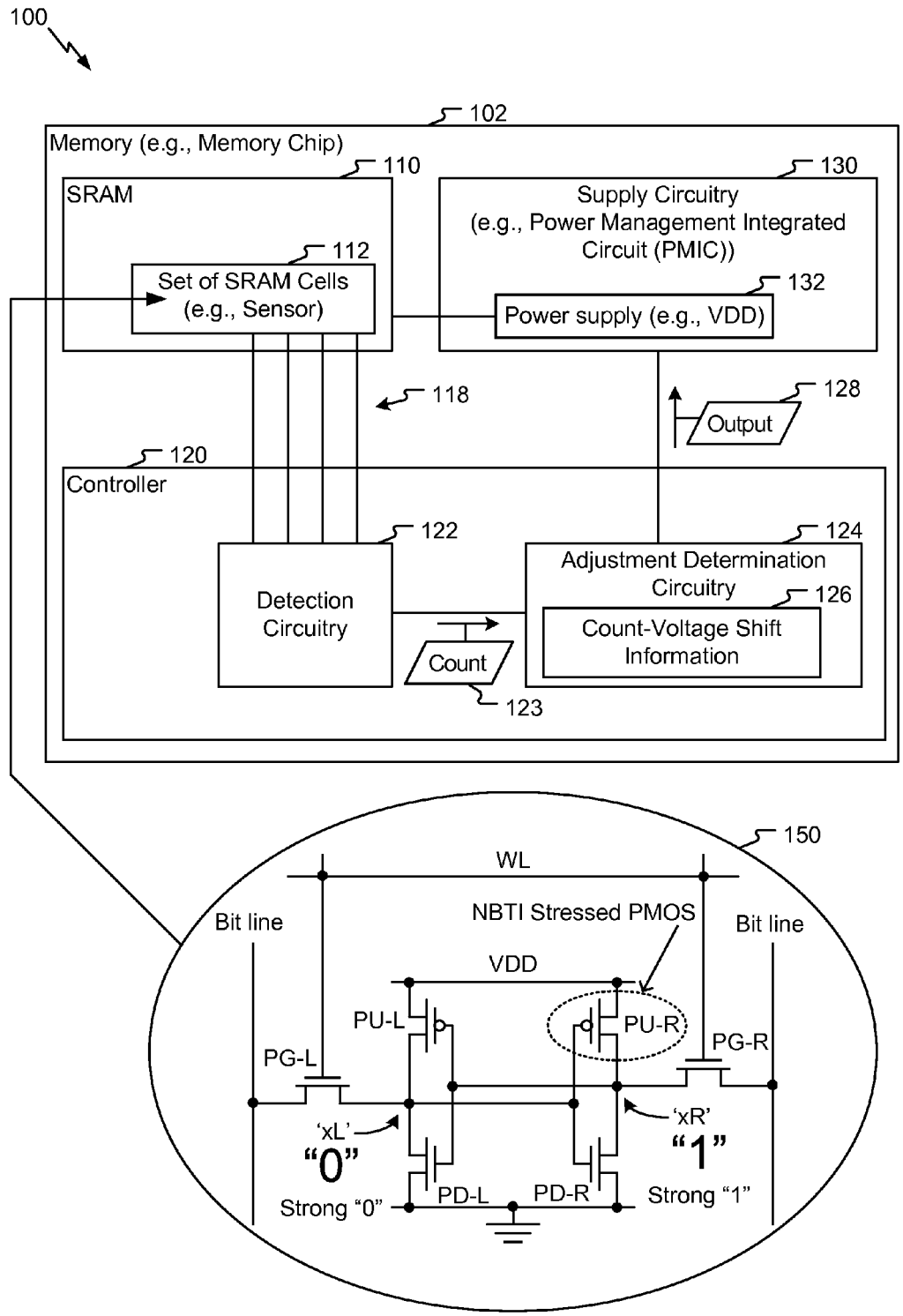

(51) Int. Cl.
*G11C 29/24* (2006.01)
*G11C 29/50* (2006.01)
*G11C 29/04* (2006.01)

(52) U.S. Cl.
CPC ............ *G11C 2029/0407* (2013.01); *G11C 2029/0409* (2013.01); *G11C 2029/5002* (2013.01)

(56) References Cited

U.S. PATENT DOCUMENTS

| 8,299,825 | B2 | 10/2012 | Noorlag et al. | |
|---|---|---|---|---|
| 2003/0031044 | A1* | 2/2003 | Higeta | G11C 11/417 365/156 |
| 2009/0285044 | A1* | 11/2009 | Chen | G11C 29/10 365/201 |
| 2010/0195384 | A1* | 8/2010 | Sharon | G11C 29/50 365/185.02 |
| 2013/0003442 | A1* | 1/2013 | Asthana | G11C 5/147 365/154 |
| 2013/0021864 | A1 | 1/2013 | Deng et al. | |
| 2014/0022008 | A1 | 1/2014 | Noorlag et al. | |
| 2014/0097856 | A1 | 4/2014 | Chen et al. | |
| 2014/0312873 | A1 | 10/2014 | Raja et al. | |

OTHER PUBLICATIONS

Holocomb, D.E., et al., "Power-Up SRAM State as an Identifying Fingerprint and Source of True Random Numbers," IEEE Transactions on Computers, Nov. 2008, vol. 57, No. 11, IEEE, Piscataway, NJ, pp. 1-14.

Pouyan, P., et al., "Design and Implementation of an Adaptive Proactive Reconfiguration Technique for SRAM Caches," Design, Automation & Test in Europe Conference & Exhibition (DATE), Mar. 2013, IEEE, Piscataway, NJ, pp. 1303-1306.

Qi, Z., et al., "SRAM-Based NBTI/PBTI Sensor System Design," 2010 47th ACM/IEEE Design and Automation Conference (DAC), Jun. 2010, IEEE, Piscataway, NJ, pp. 849-852.

International Search Report and Written Opinion for International Application No. PCT/US2016/015916, ISA/EPO, dated May 13, 2016, 16 pages.

* cited by examiner

STATIC RANDOM-ACCESS MEMORY (SRAM) SENSOR FOR BIAS TEMPERATURE INSTABILITY

I. FIELD

The present disclosure is generally related to a static random-access memory (SRAM) sensor.

II. DESCRIPTION OF RELATED ART

A computing device, such as a wireless computing device, may include one or more memories, such as a static random-access memory (SRAM) that includes an array of memory cells. Performance and reliability of a SRAM may degrade over time resulting from bias temperature instability (BTI) experienced at cells of the SRAM. For example, negative BTI (NBTI) may degrade a p-type metal-oxide semiconductor (pMOS) transistor and a positive BTI (PBTI) may degrade an n-type metal-oxide semiconductor (nMOS) transistor. Conventional approaches to combat SRAM degradation include designing the SRAM with sufficient margins (e.g., guard bands to allow for varying supply voltages or varying amounts of noise) to account for the degradation throughout an operational life of the SRAM. Designing the SRAM with sufficient margins to account for a worst case estimation of degradation increases the size, cost, and power usage of the SRAM.

III. SUMMARY

The present disclosure describes a sensor, such as an on-chip SRAM aging sensor, for a SRAM. The sensor may include a set of SRAM cells (e.g., multiple SRAM cells, such as an array of SRAM cells) of the SRAM. The cells of the SRAM (e.g., the set of SRAM cells) may be substantially uniform. For example, each of the cells may be substantially the same size, may have the substantially the same operating characteristics, and/or may be manufactured using a common process. For example, the cells having substantially the same size may have pull-up transistor gate widths that are substantially the same, pull-down transistor gate widths that are substantially the same, and/or pass gate transistor gate widths that are substantially the same, as illustrative, non-limiting examples. As another example, cells having substantially the same operating characteristics may have substantially the same pull-up to pull-down ratio and/or substantially the same pull-up to pass gate ratio.

The sensor may be configured to determine degradation (e.g., aging) associated with usage of the SRAM. For example, the degradation may be associated with a bias temperature instability (BTI), such as negative BTI (NBTI) or positive BTI (PBTI), which may be experienced at one or more SRAM cells of the SRAM. Upon a power-up operation, each SRAM cell of the sensor (e.g., the set of SRAM cells) may provide data to indicate an initial state of the SRAM cell responsive to the power-up operation. Circuitry, such as a counter, may be configured to determine a number of cells of the sensor (e.g., the set of SRAM cells) associated with a particular state, such as a first state or a second state. Based on the number of cells having the particular state responsive to the power-up operation, the circuitry may be configured to initiate a corrective action to account for degradation experienced by the SRAM. For example, an estimated amount of voltage shift may be determined based on the number of cells having the particular state, and a voltage provided to the SRAM may be adjusted based on the estimated amount of voltage shift. To illustrate, a supply voltage provided to the SRAM (including the set of SRAM cells) may be increased to account for the estimated amount of voltage shift.

In a particular aspect, an apparatus includes an array of static random-access memory (SRAM) cells. Each SRAM cell of the array has a size within a target range. The apparatus further includes circuitry configured to initiate a corrective action related to the array. The corrective action is based on a number of SRAM cells of the array that have a particular state.

In another particular aspect, an apparatus includes a static random-access memory (SRAM). The apparatus further includes circuitry configured to initiate a corrective action based on a number of SRAM cells that have a particular state responsive to a power-up of the SRAM.

In another particular aspect, a method includes detecting a power-up of a static random-access memory (SRAM). The method also includes determining a number of SRAM cells of an array of SRAM cells of the SRAM having a particular state responsive to the power-up. The method further includes initiating a corrective action based on the number of SRAM cells having the particular state.

In another particular aspect, an apparatus includes a static random-access memory (SRAM) including an on-chip sensor. The apparatus also includes a controller configured to determine an estimated amount of voltage shift of a transistor threshold voltage based on measurement of state values of the on-chip sensor. The apparatus further includes a circuit configured to adjust a supply voltage provided to the SRAM based on the estimated amount of voltage shift.

One particular advantage provided by at least one of the disclosed embodiments is an on-chip aging sensor for an SRAM that determines a reliability of the SRAM during an operational life of the SRAM. For example, the reliability of the SRAM may degrade during the operational life of the SRAM due to bias temperature instability (BTI) experienced by the SRAM. To illustrate, degradation (e.g., aging) of the SRAM may be dynamically estimated during an operational life of the SRAM and one or more corrective actions may be initiated to reduce one or more effects of the degradation. By being able to dynamically estimate the degradation and to take a corrective action, the SRAM may be designed and may operate with reduced operating margins, such as a voltage supply margin or a noise margin, as compared to SRAM devices that are not able to dynamically estimate degradation. Operating with reduced voltage and/or noise margins may provide cost and power savings as compared to the SRAM devices that are not able to dynamically estimate degradation. Additionally, by having the cells of the SRAM be substantially uniform, a set of SRAM cells of the SRAM may be used as the senor without an additional cost of manufacturing the SRAM as compared to SRAM devices that include a sensor having specialized cells that are not substantially uniform with an SRAM.

Other aspects, advantages, and features of the present disclosure will become apparent after review of the entire application, including the following sections: Brief Description of the Drawings, Detailed Description, and the Claims.

IV. BRIEF DESCRIPTION OF THE DRAWINGS

Figure 2:
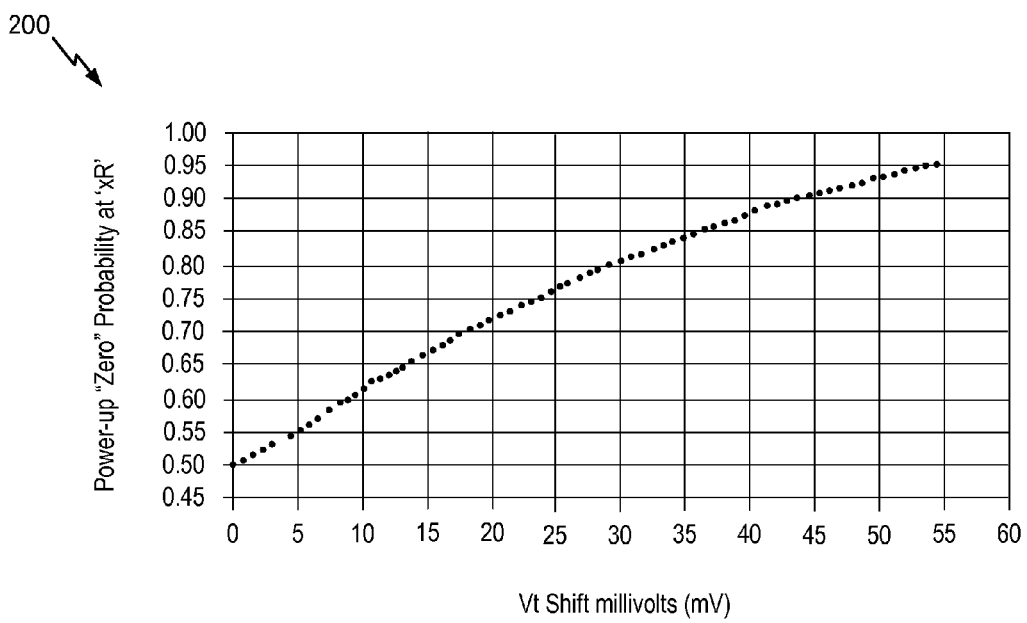
Figure 2:
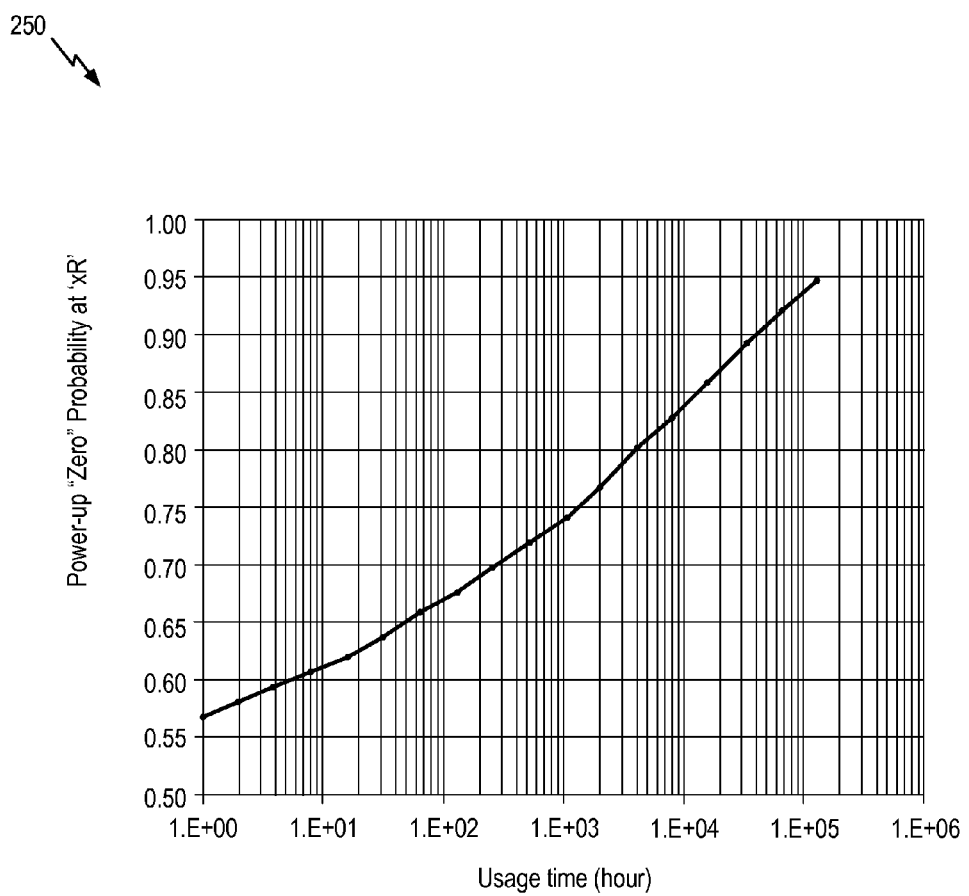
Figure 3:
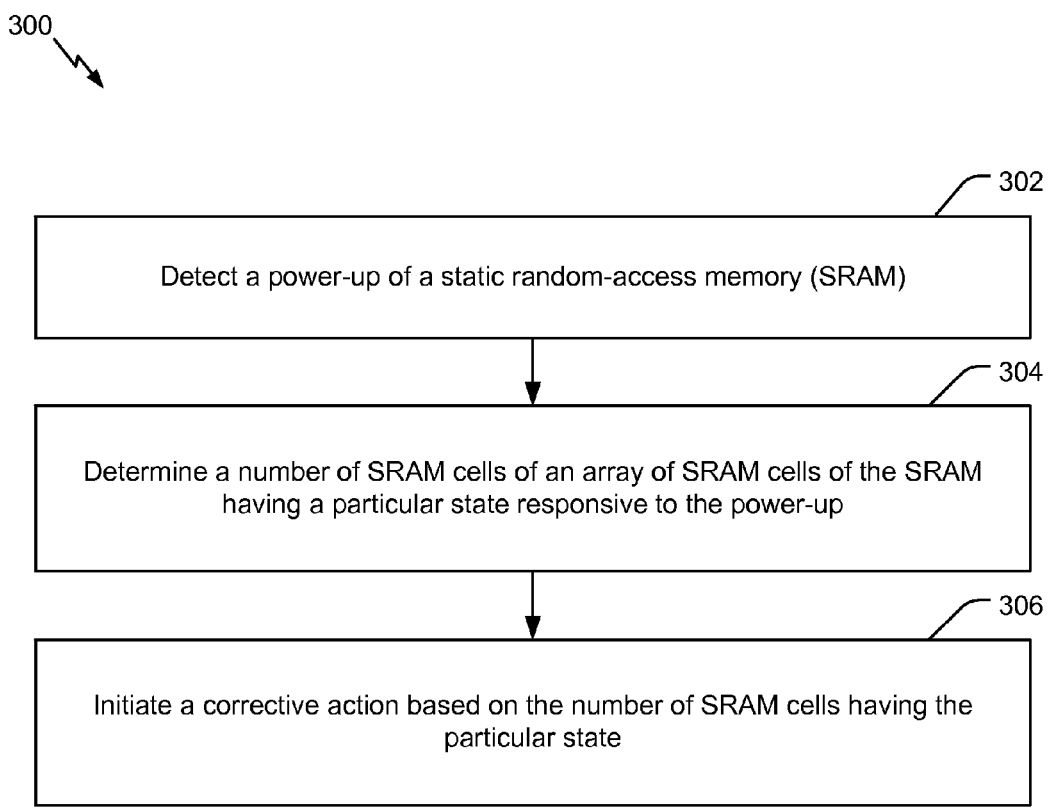
Figure 4:
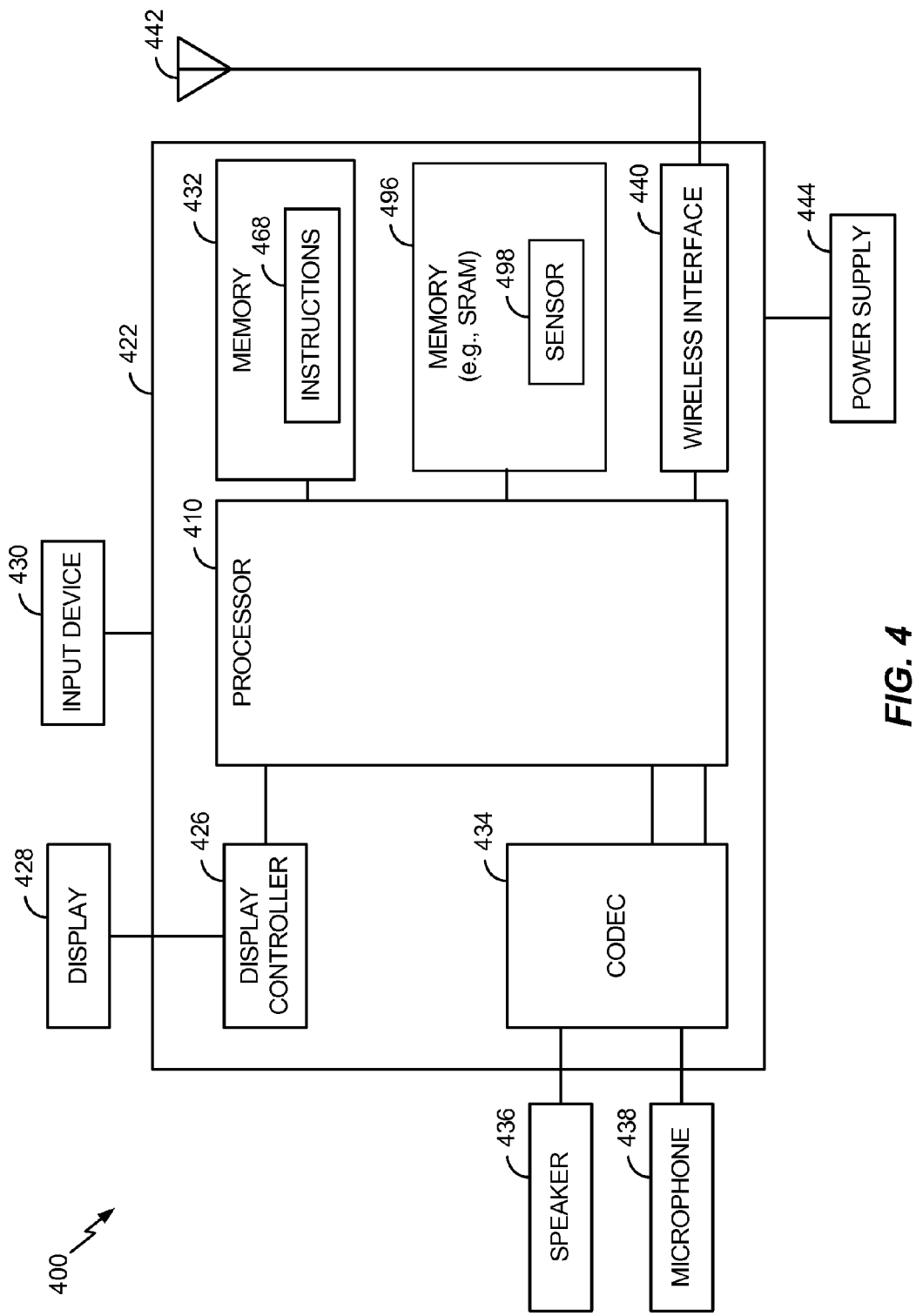

FIG. 1 is a block diagram of a particular illustrative embodiment of a system configured to determine degradation associated with usage of a static random-access memory (SRAM);

FIG. 2 includes graphs that illustrate degradation of a static random-access memory (SRAM);

FIG. 3 is a flow chart of a particular illustrative embodiment of a method of operating a static random-access memory (SRAM); and FIG. 4 is a block diagram of an electronic device including the memory of FIG. 1.

V. DETAILED DESCRIPTION

Particular embodiments of the present disclosure are described below with reference to the drawings. In the description, common features are designated by common reference numbers.

Referring to FIG. 1, a particular illustrative embodiment of a system 100 configured to determine degradation (e.g., aging) associated with operational usage of a static random-access memory (SRAM) is disclosed. The system 100 includes a memory 102, such as a memory chip (e.g., a memory die). The memory 102 may include a static random-access memory (SRAM) array 110, a controller 120, and supply circuitry 130.

The SRAM 110 may include a plurality of SRAM cells. The cells of the SRAM 110 (e.g., the set of SRAM cells 112) may be substantially uniform. For example, cells that are substantially uniform may be substantially the same size, may have the substantially the same operating characteristics, and/or may be manufactured using a common process. Cells that are substantially the same size may have corresponding components (e.g., transistors, such as pull-up transistors, pull-down transistors, pass gate transistor, etc.) that have one or more characteristics (e.g., a gate width, a gate length, a resistance, an effective channel resistivity, operating voltage, etc.) within a target range, such as a target range based on tolerances associated with a design process, an operating tolerance, and/or a manufacturing process (e.g., fabrication process). Cells that have substantially the same operating characteristics may have corresponding operating ratios (e.g., a pull-up to pull-down ratio ($\alpha$) and/or a pull-up to pass gate ratio ($\beta$)) having values within a target range, such as a target range based on tolerances associated with design processes and/or manufacturing processes (e.g., fabrication processes) associated with the transistors on which the ratio is based.

A set of SRAM cells 112 of the SRAM 110 may be configured to operate as a sensor (e.g., an on-chip SRAM sensor). The set of SRAM cells 112 may include cells that correspond to one or more rows and one or more columns of the SRAM 110. A first number of SRAM cells included in the set of SRAM cells 112 may be the same as or less than a second number of SRAM cells included in the SRAM 110. In some implementations, the set of SRAM cells 112 may include multiple SRAM cells of the SRAM 110 and may be used as an on-chip sensor. By using cells of the SRAM 110 as the sensor, a separate process is not needed to incorporate the sensor (e.g., an on-chip sensor) into the SRAM 110.

A representative SRAM cell that may be included in the set of SRAM cells 112 is depicted at 150. Because the cells of the SRAM 110 are substantially uniform, the SRAM cell 150 may also be representative of a cell included in the SRAM 110 that is not included in the set of SRAM cells 112. The SRAM cell 150 may be coupled to a wordline (WL) and to two bit lines. The SRAM cell 150 may include a set of transistors, such as two pull-up transistors PU-L, PU-R, two pull-down transistors PD-L, PD-R, and two pass gate transistors PG-L, PG-R. Although the SRAM cell 150 is illustrated as including six transistors, in other implementations, the SRAM cell 150 may include more than six transistors. Each of the pull-up transistors PU-L, PU-R may be a p-type metal oxide semiconductor (pMOS) transistor. Each of the pull-down transistors PD-L, PD-R and the pass gate transistors PG-L, PG-R may be an n-type metal oxide semiconductor (nMOS) transistor. The pull-up transistors PU-L, PU-R may be coupled to a supply voltage (VDD) and the pull-down transistors PD-L, PD-R may be coupled to ground. Each of the pass gate transistors PG-L, PG-R may be coupled to the wordline WL and to a corresponding bit line.

Each of the pull-up transistors PU-L, PU-R may have a first size within a first target range. For example, the first size may include or correspond to a gate width, a gate length, a resistance, an effective channel resistivity, or a combination thereof, as illustrative, non-limiting examples. The first target range may include or correspond to a design tolerance, a manufacturing tolerance, an operating parameter tolerance, or a combination thereof, as illustrative, non-limiting examples. In some implementations, the pull-up transistor PU-L may be substantially the same as the pull-up transistor PU-R. Two transistors may be substantially the same if each of the transistors has one or more characteristics (e.g., a gate width, a gate length, a resistance, an effective channel resistivity, operating voltage, etc.) within a target range, such as a target range based on tolerances associated with a design process and/or a manufacturing process (e.g., fabrication process).

Each of the pull-down transistors PD-L, PD-R may have a second size within a second target range. For example, the second size may include or correspond to a gate width, a gate length, a resistance, an effective channel resistivity, or a combination thereof, as illustrative, non-limiting examples. The second target range may include or correspond to a design tolerance, a manufacturing tolerance, an operating parameter tolerance, or a combination thereof, as illustrative, non-limiting examples. In some implementations, the pull-down transistor PD-L may be substantially the same as the pull-down transistor PD-R.

Each of the pass gate transistors PG-L, PG-R may have a third size within a third target range. For example, the third size may include or correspond to a gate width, a gate length, a resistance, an effective channel resistivity, or a combination thereof, as illustrative, non-limiting examples. The third target range may include or correspond to a design tolerance, a manufacturing tolerance, an operating parameter tolerance, or a combination thereof, as illustrative, non-limiting examples. In some implementations, the pass gate transistor PG-L may be substantially the same as the pass gate transistor PG-R.

The SRAM cell 150 may be associated with a pull-up to pull-down ratio ($\alpha$) and a pull-up to pass gate ratio ($\beta$). The pull-up to pull-down ratio ($\alpha$) may be based on the pull-up transistor PU-L and the pull-down transistor PD-L, or may be based on the pull-up transistor PU-R and the pull-down transistor PD-R. In some implementations, the SRAM cell 150 may include a first pull-up to pull-down ratio ($\alpha^1$) that corresponds to the pull-up transistor PU-L and the pull-down transistor PD-L and a second pull-up to pull-down ratio ($\alpha^2$) that corresponds to the pull-up transistor PU-R and the pull-down transistor PD-R. The first pull-up to pull-down ratio ($\alpha^1$) may be substantially the same as the second pull-up to pull-down ratio ($\alpha^2$). Two ratios may be substantially the same if each of the ratios has a value within a target range, such as a target range based on tolerances associated with design processes and/or manufacturing processes (e.g., fabrication processes) associated with the transistors on which the ratio is based.

The pull-up to pass gate ratio (β) may be based on the pull-up transistor PU-L and the pass gate transistor PG-L, or may be based on the pull-up transistor PU-R and the pass gate transistor PG-R. In some implementations, the SRAM cell 150 may include a first pull-up to pass gate ratio ($β^1$) that corresponds to the pull-up transistor PU-L and the pass gate transistor PG-L and a second pull-up to pass gate ratio ($β^2$) that corresponds to the pull-up transistor PU-R and the pass gate transistor PG-R. The first pull-up to pass gate ratio ($β^1$) may be substantially the same as the second pull-up to pass gate ratio ($β^2$).

The SRAM cell 150 may include nodes xL and xR which are configured to store complementary values. For example, when the SRAM cell 150 is in a "01" state, the node xL stores a logical "0" value and the node xR stores a logical "1" value. As another example, when the SRAM cell 150 is in a "10" state, the node xL stores a logical "1" value and the node xR stores a logical "0" value.

The SRAM 110 (e.g., the set of SRAM cells 112) is configured to have a statistical probability of fifty percent of the set of SRAM cells 112 having a particular state (e.g., a "01" state or a "10" state) as an initial state responsive to a power-up operation. To illustrate, at a beginning-of-life of the SRAM 110, each of the cells of the SRAM 110 has an equal probability of starting in a "01" state or a "10" state (e.g., approximately 50% of cells in the "01" state and 50% of cells in the "10" state). However, over an operational life of the SRAM 110, effects of bias temperature instability (BTI) experienced by the SRAM 110 may degrade one or more SRAM cells of the SRAM 110. BTI may be induced by circuit (e.g., SRAM cell) inactivity, such as when a memory cell is maintained in a static state in which voltage is applied to a transistor input for a prolonged period of time. BTI can affect transistor voltages thresholds and result in increased circuit delay. For example, effects of negative BTI (NBTI) may degrade pMOS transistors and effects of positive BTI (PBTI) may degrade nMOS transistors. The degradation may be measured by determining a percentage shift from 50% of the cells starting in the "01" state and 50% of the cells starting in the "10" state. For example, a percentage shift may occur as the SRAM 110 is used over time, such that an imbalance occurs between SRAM cells starting in the "01" state and SRAM cells starting in the "10" state. A degree of the percentage shift may indicate a degree of degradation of the SRAM 110.

Each cell of the set of SRAM cells 112 may be coupled to the controller 120 and configured to provide an indication of a value (e.g., a logical value) of the cell. For example, each cell of the set of SRAM cells 112 may have one or more nodes (e.g., the xL node and/or the xR node) coupled to the controller 120. In some implementations, each cell of the set of SRAM cells 112 may have a single node coupled to the controller 120. The single node may be the same node (e.g., the xR node) for each cell of the set of SRAM cells 112.

The controller 120 may be configured to estimate an amount of degradation of the SRAM 110 based on values received from the set of SRAM cells 112 (e.g., the sensor), as described herein. The amount of degradation may provide an indication of a reliability of the SRAM 110. The controller 120 may include circuitry, such as detection circuitry 122 and adjustment determination circuitry 124. The detection circuitry 122 may be coupled to the set of SRAM cells 112 via lines 118. Each line may be coupled to a different SRAM cell and may be configured to provide the detection circuitry 122 with an indication of a state of the SRAM cell. For example, each of the lines 118 may be coupled to an xR node of a corresponding SRAM cell. The detection circuitry 122 may be configured to read logical values of the set of SRAM cells 112 indicated by the lines 118. For example, the detection circuitry 122 may read the logical values responsive to a power-up of the SRAM 110.

The detection circuitry 122 may determine a number (e.g., a count 123) of cells of the set of SRAM cells 112 having a particular state. For example, the particular state of an SRAM cell of the set of SRAM cells 112 may be determined based on a logical value of a single node of the SRAM cell. When the lines 118 are coupled to xR nodes, the detection circuitry 122 may determine a number of cells in a "1" state (corresponding to a "01" state) or in a "0" state (corresponding to a "10" state). In some implementations, the detection circuitry 122 may include a counter configured to count (e.g., determine) the number of SRAM cells that have the particular state responsive to a power-up operation, such as a power-up of the SRAM 110. For example, the counter may determine the number of SRAM cells that have the particular state based on the logical values read by the detection circuitry 122. The number of SRAM cells that have the particular state may enable the controller 120 to detect an imbalance in a first number of SRAM cells of the set of SRAM cells 112 that have an initial state of "01" responsive to a power-up operation and a second number of SRAM cells of the set of SRAM cells 112 that have an initial state of "10" responsive to the power-up operation. The detection circuitry 122 may provide the count 123 to the adjustment determination circuitry 124.

The adjustment determination circuitry 124 may be configured to estimate an amount of voltage shift based on the count 123. The adjustment determination circuitry 124 may include count-voltage shift information 126. The count-voltage shift information 126 may be calibrated (e.g., programmed) to indicate an estimated amount of voltage shift needed to compensate for degradation experienced by the set of SRAM cells 112 as indicated by the count 123 (e.g., a number of SRAM cells of the set of SRAM cells 112 having the particular state, such as a percentage of the set of SRAM cells 112 having the particular state). To illustrate, the number of SRAM cells of the set of SRAM cells 112 having the particular state may be associated with an amount of voltage shift. The amount of voltage shift may correspond to an amount that the supply voltage (VDD) is to be adjusted at a particular time to account for degradation experienced by the SRAM 110 and to improve a reliability of the SRAM 110. A percentage shift based on the number of SRAM cells having the particular state may have a substantially linear relationship with an amount of voltage shift, which in turn may be logarithmically related to time (e.g., an operational time of the SRAM 110). For example, referring to FIG. 2, graphs are depicted that illustrate different numbers (e.g., different percentages) of the SRAM cells of the set of SRAM cells 112 as they relate to an amount of voltage shift and to an amount of usage time.

A first graph 200 illustrates a power-up probability of the set of SRAM cells 112 having a particular state (e.g., logical "0" state) at the xR node along the y-axis and an amount of voltage shift in millivolts (mV) along the x-axis. As indicated by the first graph 200, as the number of SRAM cells having the logical "0" state increases, so does an amount of voltage shift. The relationship between an increase in the number (e.g., percentage) of SRAM cells having the particular state and an increase in the amount of voltage shift may be relatively linear.

A second graph 250 illustrates a power-up probability of the set of SRAM cells 112 having a particular state (e.g., logical "0" state) at the xR node along the y-axis and a usage time of the SRAM 110 in hours along the x-axis, which is logarithmically graphed. As the usage time of the SRAM 110 increases, so does the number of SRAM cells having the logical "0" state. As indicated by the second graph 250, an increase in the percentage shift has a substantially linear relationship with time (e.g., an operational time of the SRAM 110) as plotted on a logarithmic scale. Accordingly, in view of the first graph 200 and the second graph 250, an increase in the percentage shift has a substantially linear relationship with an amount of voltage shift, which in turn is logarithmically related to time (e.g., an operational time of the SRAM 110). Therefore, based on the percentage shift at particular time, a corresponding usage time of the SRAM 110 may be determined (e.g., calculated) and a corresponding amount of voltage shift may be determined (e.g., calculated). The amount of voltage shift may correspond to an amount that the supply voltage (VDD) is to be adjusted at the particular time to correct for the voltage shift. Correcting for the voltage shift may account for degradation experienced by the SRAM 110 and may improve a reliability of the SRAM 110.

Referring again to FIG. 1, the count-voltage shift information 126 may include one or more thresholds, where each threshold is associated with a different number (e.g., a different percentage) of SRAM cells having the particular state, a voltage shift amount, or a combination thereof. Additionally or alternatively, the count-voltage shift information 126 may include one or more threshold ranges. In some implementations, the adjustment determination circuitry 124 may calculate a percentage of the set of SRAM cells 112 having the particular state. The adjustment determination circuitry 124 may compare the count 123 (e.g., the percentage) to a threshold value (or a threshold range) included in the count-voltage shift information 126. Based on the comparison, the adjustment determination circuitry 124 generates an output 128 associated with a corrective action. The corrective action may include or correspond to adjusting a supply voltage (VDD) provided to the SRAM 110. For example, the supply voltage (VDD) may be adjusted by an estimated amount of voltage shift. As another example, the corrective action may include or correspond to adjusting a wordline under-drive value applied during a read operations performed at the SRAM 110 and/or adjusting a read current applied to cells of the SRAM 110 during the read operation. Additionally or alternatively, the corrective action may include or correspond to modifying an error correction scheme, such as increasing an error correction capability of a decoder and/or increasing a number of parity bits associate with data stored at the SRAM 110. The adjustment determination circuitry 124 may send the output 128 to one or more components included in or coupled to the system 100. The one or more components may be configured to initiate execution of and/or to execute the corrective action associated with the output 128.

As an illustrative example of operation of the adjustment determination circuitry 124, the adjustment determination circuitry 124 may receive a first count, such as the count 123. The adjustment determination circuitry 124 may compare the first count to one or more threshold ranges. For example, each threshold range may be associated with a different percentage range of a total number of cells included in the set of SRAM cells 112. To illustrate, a first threshold range may include greater than 50% and less than 55%, a second threshold range may include greater than or equal to 55% and less than 60%, a third threshold range may include greater than or equal to 60% and less than 65%, etc. In response to a determination that the first count is not within a threshold range (e.g., is less than 50%), the adjustment determination circuitry 124 may not generate an output. In response to a determination that the first count is within a particular threshold range, the adjustment determination circuitry 124 may generate a first output, such as the output 128 associated with a first corrective action. For example, the first corrective action may be associated with increasing the supply voltage by a first amount that corresponds to the particular threshold range. For example, when the particular threshold range is the first threshold range, the first amount may be equal to 5 mV. As another example, when the particular threshold range is the second threshold range, the first amount may be equal to 10 mV. The first amount may include or correspond to an estimated amount of voltage shift experienced by the SRAM 110.

Each time the SRAM 110 is powered on, the adjustment determination circuitry 124 may receive a count. Based on the count, the adjustment determination circuitry 124 identifies a particular threshold range that includes the count and generates a corrective action to adjust the supply voltage (VDD) by an amount that corresponds to the particular threshold range.

In other implementations, the adjustment determination circuitry 124 may receive a count, such as the count 123, and may calculate a percentage based on the count. For example, the adjustment determination circuitry may divide the count by the total number of cells included in the set of SRAM cells 112 and multiple by 100. The adjustment determination circuitry 124 may subtract 50% from the calculated percentage to determine a percentage shift. The adjustment determination circuitry 124 may access the count-voltage shift information 126 to determine a relationship between the percentage shift and an amount of voltage shift. For example, the relationship may be linear and may indicate that for each 1% of voltage shift, the amount of voltage shift is 0.9 mV. Accordingly, based on the determined percentage shift, the adjustment determination circuitry 124 may calculate a particular amount of voltage shift. The adjustment determination circuitry 124 may generate the output 128 to initiate a corrective action to adjust (e.g., increase) the supply voltage (VDD) by the particular amount of voltage shift.

The output 128 of the adjustment determination circuitry 124 may be provided to the supply circuitry 130. For example, the supply circuitry 130 (e.g., a power supply circuit) may include or correspond to a power management integrated circuit (PMIC). The supply circuitry 130 may include or may be coupled to a power supply 132, such as a power supply configured to provide the supply voltage (VDD) to the SRAM 110. For example, the power supply 132 may be a common supply to the set of SRAM cells 112 and to other cells of the SRAM 110 (e.g., the SRAM 110 may be powered by a single power supply that is common to each cell of the SRAM 110). The supply circuitry 130 may be configured to detect a power-on request and to provide the supply voltage (VDD) to the SRAM 110 responsive to the power-on request. For example, a device coupled to the memory 102 may send a power-on request to the supply circuitry 130 when the device wants to store data at the SRAM 110. As another example, the power-on request may be responsive to a user input of a user that wants to use a device that includes the memory 102. Additionally, responsive to the output 128 (e.g., an output signal), the supply circuitry 130 may adjust a value of the supply voltage (VDD) provided to the SRAM 110. For example, the supply circuitry 130 may perform the corrective action associated with the output 128 to adjust a value of the voltage provided by the power supply 132. To illustrate, the supply circuitry 130 may increase the value of the supply voltage (VDD) provided by the power supply 132 according to an amount indicated by the output 128. Adjusting (e.g., increasing) the supply voltage (VDD) based on the amount indicated by the output 128 may account (e.g., correct) for the estimated amount of voltage shift determined by the adjustment determination circuitry 124.

During operation of the system 100, the supply circuitry 130 may initiate a power-up operation that causes the power supply 132 to provide a supply voltage (VDD) to the SRAM 110. Each time the power supply 132 powers on the SRAM 110, the power supply 132 provides the supply voltage (VDD). The supply voltage (VDD) provided to the SRAM 110 may cause the SRAM cells of the SRAM 110 to enter a corresponding initial state (e.g., a "10" state or a "01" state).

In response to the power-on operation, the controller 120 (e.g., the detection circuitry 122) may measure state values of SRAM cells included in the set of SRAM cells 112 (e.g., cells of the on-chip sensor). For example, the controller 120 may determine a number of SRAM cells of the set of SRAM cells 112 (e.g., an on-chip sensor) that have a particular state. The controller 120 (e.g., the adjustment determination circuitry 124) may compare the number to a threshold value, such as a threshold value included in the count-voltage shift information 126. In response to the number being greater than or equal to the threshold value, the controller 120 may estimate an amount of a voltage adjustment to be added to the supply voltage (VDD) provided to the SRAM 110.

The controller 120 may generate the output 128 (e.g., an output signal) based on the estimated amount of voltage adjustment. For example, the output 128 may indicate an amount that the supply voltage (VDD) is to be adjusted (e.g., increased). The output 128 may be provided to the supply circuitry 130 and the supply circuitry 130 may initiate a corrective action to account for (e.g., correct) the estimated amount of voltage adjustment. For example, the supply circuitry 130 may adjust the power supply 132 to increase the supply voltage (VDD) responsive to the output 128. After the supply voltage (VDD) is increased, the SRAM 110 may operate for a period of time until a power-off operation is performed. For example, the power-off operation may be initiated by a user of a device that includes the memory 102. The user may cause a power-off request to be provided to the supply circuitry 130 and the supply circuitry 130 may initiate a power-off operation (e.g., no voltage is supplied to the SRAM 110 by the power supply 132).

Subsequent to the power-off operation, the supply circuitry 130 may initiate a second power-up operation that causes the power supply 132 to provide the supply voltage (VDD) to the SRAM 110. For example, the power-up operation may be responsive to power-on request initiated by a user of device that include the memory 102. Responsive to the second power-on operation, the controller 120 may determine a second number of SRAM cells of the set of SRAM cells 112 that have the particular state. The controller 120 may compare the second number to a second threshold value, such as a second threshold value included in the count-voltage shift information 126. In response to the second number being less than the second threshold value, the controller 120 may not provide an output signal 128 to adjust (e.g., increase) the previously adjusted supply voltage (VDD).

In some implementations, each SRAM cell of the SRAM 110 (e.g., the set of SRAM cells 112) that is substantially uniform may have a size within a target range. For example, the size may correspond to a pull-up transistor gate width, a pull-up transistor gate length, a pull-up transistor channel resistance, a pull-down transistor gate width, a pull-down transistor gate length, a pull-down transistor channel resistance, a pass gate transistor gate width, a pass gate transistor gate length, or a pass gate transistor channel resistance, as illustrative, non-limiting examples. The target range may include or correspond to one or more tolerances associated with the SRAM cells and/or transistors included in the SRAM cells, such as a design tolerance, a manufacturing tolerance (e.g., a fabrication tolerance), or an operating parameter tolerance, as illustrative, non-limiting examples. Additionally or alternatively, each SRAM cell of the SRAM 110 (e.g., the set of SRAM cells 112) that is substantially uniform may have substantially the same pull-up to pull-down ratio ($\alpha$) and/or substantially the same pull-up to pass gate ratio ($\beta$).

In some implementations, after the controller 120 measures state values of the set of SRAM cells 112 (e.g., determines a number of SRAM cells having the particular state) responsive to a power-on operation, the controller 120 may program each cell of the set of SRAM cells 112 to the same state (e.g., a strong "01" state or a strong "10" state) to stress (e.g., age) the set of SRAM cells 112 during operation of the SRAM 110. Programming each SRAM cell of the set of SRAM cells 112 to the strong "01" state or the strong "10" state may age the set of SRAM cells 112 at a faster rate than the cells of the SRAM 110 other than the set of SRAM cells 112 (e.g., the sensor). To illustrate, because the strong "01" state or the strong "10" state maintained during operation of the SRAM 110, the set of SRAM cells 112 experience BTI based on the strong "01" state or the strong "10" state being maintained. The cells of the SRAM 110 other than the set of SRAM cells 112 may be randomly programmed during operation of the SRAM 110 and may not maintain storage states for prolonged periods of time and may not experience BTIs that degrade the cells. Stated another way, programming the set of SRAM cells 112 to the strong "01" state or the strong "10" state may increase a linearity of the percentage shift relative to the usage time (on a logarithmic scale).

In other implementations, the SRAM cells of the set of SRAM cells 112 may be used as part of the SRAM 110 to store data during operational usage of the SRAM 110. By using the set of SRAM cells 112 as part of the SRAM 110, a storage capacity of the SRAM 110 may be increased because the set of SRAM cells 112 may be available to store data.

As described with reference to FIG. 1, an on-chip aging sensor (e.g., the set of SRAM cells 112) for the SRAM 110 is disclosed. The on-chip sensor may be used to determine a reliability of the SRAM 110 during an operational life of the SRAM 110. For example, the controller 120 may determine an amount of degradation of the SRAM 110 based on a number of the set of SRAM cells 112 having a particular state. Based on the number of SRAM cells having the particular state, the controller 120 may initiate one or more corrective actions to reduce one or more effects of the degradation. For example, based on the number of SRAM cells having the particular state, an estimated amount of voltage shift may be determined and the voltage supply (VDD) of the power supply 132 may be adjusted according to the estimated amount of voltage shift. By using the set of SRAM cells 112 (e.g., the sensor) to dynamically estimate the degradation of the SRAM 110 throughout an operation life of the SRAM 110, the SRAM 110 may operate with reduced operating margins, such as a voltage supply margin or a noise margin, as compared to SRAM devices that are not able to dynamically estimate and correct for degradation. Additionally, because each of the SRAM cells of the SRAM 110 (e.g., the set of SRAM cells 112) has a size within a target range and are powered by the same power supply 132, a cost of an aging sensor is reduced as compared to systems that have an aging sensor that is separate from an SRAM, have a sensor that includes SRAM cells that are designed with different operating characteristics that other cells of an SRAM, and/or that have separate power supplies for the sensor and for an SRAM.

Referring to FIG. 3, a flow diagram of an illustrative embodiment of a method 300 of operating a static random-access memory (SRAM) is depicted. For example, the SRAM may include or correspond to memory 102 (e.g., the SRAM 110) of FIG. 1. The method 300 may be performed by the memory 102, the controller 120, the detection circuitry 122, and/or the adjustment determination circuitry 124 of FIG. 1.

The method 300 includes detecting a power-up of a static random-access memory (SRAM), at 302. The SRAM may be powered-up by a power supply, such as the power supply 132 of FIG. 1. A controller associated with the SRAM may be configured to detect the power-up. For example, the controller 120 may be configured to detect a power-up of the SRAM 110 of FIG. 1.

The method 300 further includes determining a number of SRAM cells of an array of SRAM cells of the SRAM having a particular state responsive to the power-up, at 304. The array may include or correspond to a sensor (e.g., an aging sensor) of the SRAM, such as an on-chip aging sensor of the SRAM. For example, the array may include or correspond to the set of SRAM cells 112 of FIG. 1. Responsive to the power-up, each cell of the array may be initialized to one of a first state (e.g., a "01" state) or a second state (e.g., a "10" state). In some implementations, the controller may be configured to determine the number of SRAM cells having the particular state (e.g., the "01" state or the "10" state). For example, the controller may include a counter that is configured to determine, based on logical values read from the array, the number of SRAM cells having the particular state. In some implementations, the number of SRAM cells may include or correspond to the count 123 of FIG. 1.

The method 300 also includes initiating a corrective action based on the number of SRAM cells having the particular state, at 306. In some implementations, the number of SRAM cells may be converted into a percentage and/or a percentage shift, and the corrective action may be based on the percentage and/or the percentage shift. The corrective action may include or correspond to adjusting a supply voltage provided to the SRAM, adjusting a wordline under-drive value applied during a read operation, adjusting a read current applied during the read operation, modifying an error correction scheme, or a combination thereof.

The controller may be configured to initiate the corrective action based on the number of SRAM cells having the particular state. For example, the controller may compare the number of SRAM cells to a threshold and, in response to the number of SRAM cells being greater than or equal to the threshold, the controller may initiate the corrective action. To initiate the corrective action, the controller may generate an output, such as the output 128 of FIG. 1, that indicates the corrective action. In some implementations, in response to the number of SRAM cells being greater than or equal to the threshold, the controller may determine a shift amount (e.g., a voltage shift amount) and initiate the corrective action to adjust a supply voltage (VDD) provided to the SRAM based on the voltage shift amount. To illustrate, the supply voltage (VDD) may be increased by an amount associated with the voltage shift amount. In some implementations, the controller may be able to detect (e.g., estimate) a shift amount that corresponds to less than a 5 mV change in the supply voltage (VDD).

After the supply voltage (VDD) is adjusted (based on execution of the corrective action), the SRAM may operate using the adjusted supply voltage until a power-down of the SRAM is performed. At a later time, a second power-up of the SRAM may be performed. The controller may detect the second power-up of the SRAM and may determine a second number of SRAM cells of the array having a particular state responsive to then second power-up. The second number of SRAM cells may be compared to a second threshold and, in response to the second number of SRAM cells being greater than or equal to the second threshold, a second voltage shift amount may be determined Based on the second shift amount, a second corrective action may be initiated that, upon execution, causes the supply voltage (VDD) to be increased by a second amount associated with (e.g., corresponding to) the second voltage shift amount.

The method 300 may be used to determine a reliability of the SRAM during an operational life (e.g., a usage period) of the SRAM. For example, the reliability of the SRAM may degrade during the operational life of the SRAM due to bias temperature instability (BTI) experienced by the SRAM, as an illustrative, non-limiting example. By dynamically estimating the degradation of the SRAM, the SRAM may be configured to operate with reduced operating margins, such as a voltage supply margin or a noise margin, as compared to SRAM devices that are not able to dynamically estimate degradation during operation life.

The method of FIG. 3 may be implemented by a processing unit such as a central processing unit (CPU), a controller, a field-programmable gate array (FPGA) device, an application-specific integrated circuit (ASIC), a digital signal processor (DSP), another hardware device, firmware device, or any combination thereof. In some implementations, the processing unit may be included in the controller 120 of FIG. 1. As an example, the method of FIG. 3 can be performed by one or more processors that execute instructions.

Referring to FIG. 4, a block diagram of a particular illustrative embodiment of a device 400 (e.g., an electronic device), such as a wireless communication device is depicted. The device 400 includes a processor 410, such as a digital signal processor (DSP), coupled to a memory 432 and a memory 496.

The memory 496 may include a static random-access memory (SRAM). For example, the memory 496 may include or correspond to the memory 102 and/or the SRAM 110 of FIG. 1. The memory 496 may include a sensor 498, such as an on-chip memory. The sensor 498 may include an array of SRAM cells, such as the set of SRAM cells 112 of FIG. 1.

The memory 432 includes instructions 468 (e.g., executable instructions) such as computer-readable instructions or processor-readable instructions. The instructions 468 may include one or more instructions that are executable by a computer, such as the processor 410. For example, the instructions 468, when executed by the processor 410, may cause the processor 410 to perform operations including detecting a power-up of the memory 496 (e.g., the SRAM), such as a power-up of the sensor 498 and determining a number of SRAM cells of the array (e.g., the sensor 498) having a particular state responsive to the power-up. The operations may also include initiating a corrective action based on the number of SRAM cells having the particular state.

FIG. 4 also shows a display controller 426 that is coupled to the processor 410 and to a display 428. A coder/decoder (CODEC) 434 can also be coupled to the processor 410. A speaker 436 and a microphone 438 can be coupled to the CODEC 434.

FIG. 4 also indicates that a wireless interface 440, such as a wireless controller, can be coupled to the processor 410 and to an antenna 442. In some implementations, the processor 410, the display controller 426, the memory 432, the memory 496, the CODEC 434, and the wireless interface 440 are included in a system-in-package or system-on-chip device 422. In a particular embodiment, an input device 430 and a power supply 444, such as the power supply 132 of FIG. 1, are coupled to the system-on-chip device 422. Moreover, in a particular embodiment, as illustrated in FIG. 4, the display 428, the input device 430, the speaker 436, the microphone 438, the antenna 442, and the power supply 444 are external to the system-on-chip device 422. However, each of the display 428, the input device 430, the speaker 436, the microphone 438, the antenna 442, and the power supply 444 can be coupled to a component of the system-on-chip device 422, such as an interface or a controller. In some implementations, the memory 496 may be included in a component of the device 400 or a component coupled to the device 400. For example, the memory 496 may be included in the processor 410, the wireless interface 440, the display controller 426, or other component that includes a memory (e.g., an SRAM).

In conjunction with one or more of the described embodiments of FIGS. 1-4, an apparatus is disclosed that may include means for detecting a power-up of a static random-access memory (SRAM). The means for detecting may correspond to the controller 120 of FIG. 1, the processor 410 of FIG. 4, one or more other structures or circuits configured to detect the power-up, or any combination thereof.

The apparatus may also include means for determining a number of SRAM cells of an array of SRAM cells of the SRAM having a particular state responsive to the power-up. The means for determining may correspond to the controller 120, the detection circuitry 122 of FIG. 1, the processor 410 of FIG. 4, one or more other structures or circuits configured to determine the number of SRAM cells having the particular state, or any combination thereof.

The apparatus may also include means for initiating a corrective action based on the number of SRAM cells having the particular state. The means for initiating may correspond to the controller 120, the adjustment determination circuitry 124, the supply circuitry 130 of FIG. 1, the processor 410 of FIG. 4, one or more other structures or circuits configured to initiate the corrective action, or any combination thereof.

One or more of the disclosed embodiments may be implemented in a system or an apparatus, such as the device 400, that may include a communications device, a fixed location data unit, a mobile location data unit, a mobile phone, a cellular phone, a satellite phone, a computer, a tablet, a portable computer, a display device, a media player, or a desktop computer. Alternatively or additionally, the device 400 may include a set top box, an entertainment unit, a navigation device, a personal digital assistant (PDA), a monitor, a computer monitor, a television, a tuner, a radio, a satellite radio, a music player, a digital music player, a portable music player, a video player, a digital video player, a digital video disc (DVD) player, a portable digital video player, a satellite, a vehicle, any other device that includes a memory or that stores or retrieves data or computer instructions. As another illustrative, non-limiting example, the system or the apparatus may include remote units, such as hand-held personal communication systems (PCS) units, portable data units such as global positioning system (GPS) enabled devices, meter reading equipment, or any other device that includes a processor or that stores or retrieves data or computer instructions, or any combination thereof.

Although one or more of FIGS. 1-4 may illustrate systems, apparatuses, and/or methods according to the teachings of the disclosure, the disclosure is not limited to these illustrated systems, apparatuses, and/or methods. Embodiments of the disclosure may be suitably employed in any device that includes a memory device. Additionally, one or more functions or components of any of FIGS. 1-4 as illustrated or described herein may be combined with one or more other portions of another of FIGS. 1-4. Accordingly, no single embodiment described herein should be construed as limiting and embodiments of the disclosure may be suitably combined without departing form the teachings of the disclosure.

Those of skill would further appreciate that the various illustrative logical blocks, configurations, modules, circuits, and algorithm steps described in connection with the embodiments disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art. For example, a storage medium may be coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal In the alternative, the processor and the storage medium may reside as discrete components in a computing device or user terminal.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. An apparatus comprising:
an array of static random-access memory (SRAM) cells, wherein each SRAM cell of the array has a size within a target range, wherein each SRAM cell of the array of SRAM cells is configured to be initialized to a corresponding initial state based on a supply voltage received during a power-up operation of the array; and
circuitry configured to initiate a corrective action related to the array, the corrective action based on a number of the SRAM cells of the array of SRAM cells that, responsive to the power-up operation, have a particular initial state.

2. The apparatus of claim 1, further comprising a SRAM including a plurality of SRAM cells including the array of SRAM cells, wherein the plurality of SRAM cells are substantially uniform, and wherein the corrective action accounts for degradation experienced by the array of SRAM cells.

3. The apparatus of claim 1, wherein the size of each SRAM cell corresponds to a pull-up transistor gate width, a pull-down transistor gate width, a pass gate transistor gate width, or a combination thereof, wherein the corresponding initial state of each SRAM cell comprises a "01" state or a "10" state, and wherein the particular initial state comprises the "01" state.

4. The apparatus of claim 1, wherein the corrective action includes adjusting a wordline under-drive value applied during a read operation performed at the array of SRAM cells.

5. The apparatus of claim 1, wherein the corrective action includes adjusting a read current applied during a read operation.

6. The apparatus of claim 1, wherein the target range corresponds to a manufacturing tolerance or an operating parameter tolerance.

7. The apparatus of claim 1, wherein each SRAM cell of the array of SRAM cells has substantially the same pull-up to pull-down ratio.

8. The apparatus of claim 1, wherein each SRAM cell of the array of SRAM cells has substantially the same pull-up to pass gate ratio.

9. The apparatus of claim 1, wherein the array of SRAM cells is configured to have a particular statistical probability of the SRAM cells of the array having the particular initial state responsive to the power-up operation.

10. The apparatus of claim 1, further comprising a counter configured to count the number of the SRAM cells of the array that have the particular initial state, wherein a first initial state of a first SRAM cell is determined based on a logical value of a single node of the first SRAM cell, and wherein the first initial state corresponds to a "01" state.

11. The apparatus of claim 1, wherein the corrective action includes adjusting the supply voltage provided to the array of SRAM cells, and wherein the corrective action is associated with compensating for bias temperature instability (BTI).

12. The apparatus of claim 1, wherein the circuitry is configured to:
compare the number of the SRAM cells that have the particular initial state to a threshold value; and
initiate the corrective action responsive to the number being greater than or equal to the threshold value.

13. The apparatus of claim 1, wherein the circuitry is configured to program each of the SRAM cells of the array of SRAM cells to the same state subsequent to determining the number of SRAM cells having the particular initial state.

14. The apparatus of claim 1, wherein the array and the circuitry are included in a mobile device.

15. The apparatus of claim 1, further comprising detection circuitry configured to determine the number of the SRAM cells having the particular initial state responsive to the power-up operation.

16. The apparatus of claim 1, wherein the corrective action includes adjusting a supply voltage provided to the SRAM, adjusting a wordline under-drive value applied during a read operation, adjusting a read current applied during the read operation, modifying an error correction scheme associated with the SRAM, or a combination thereof, and wherein the corrective action is configured to compensate for aging associated with usage of the array.

17. An apparatus comprising:
a static random-access memory (SRAM), wherein each SRAM cell of the SRAM is configured to be initialized to a corresponding initial state based on a supply voltage received during a power-up operation of the SRAM; and
circuitry configured to initiate a corrective action based on a number of the SRAM cells of the SRAM that, responsive to the power-up operation, have a particular initial state.

18. The apparatus of claim 17, further comprising:
detection circuitry configured to read each of the SRAM cells of the SRAM to determine the number of the SRAM cells that have the particular initial state responsive to the power-up operation; and
a common supply, wherein the common supply includes a power supply circuit configured to provide the supply voltage to the SRAM responsive to the power-up operation.

19. The apparatus of claim 18, wherein the common supply is configured to detect a power-on request and to provide the supply voltage to the SRAM responsive to the power-on request, and wherein the power-up operation of the SRAM corresponds to a transition of the SRAM cells from an unpowered state to a powered state.

20. The apparatus of claim 18, wherein the common supply is configured to perform the corrective action, and wherein the corrective action adjusts a value of the supply voltage provided by the common supply.

21. The apparatus of claim 17, wherein the corrective action includes modifying an error correction scheme associated with the SRAM.

22. A method comprising:
during a power-up operation of a static random-access memory (SRAM), initializing each SRAM cell of an array of SRAM cells of the SRAM to a corresponding initial state based on a supply voltage;
determining a number of the SRAM cells of the array of SRAM cells having a particular initial state responsive to detecting the power-up operation; and
initiating a corrective action based on the number of the SRAM cells having the particular initial state.

23. The method of claim 22, further comprising programming each of the SRAM cells of the array to the same state subsequent to determining the number of the SRAM cells having the particular initial state, wherein data is not written to the SRAM cells during a time period between the power-up operation and programming each of the SRAM cells of the array to the same state.

24. The method of claim 22, further comprising:
comparing the number of the SRAM cells to a threshold; and
in response to the number of the SRAM cells being greater than or equal to the threshold, determining a voltage shift amount, wherein the corrective action adjusts the supply voltage provided to the SRAM based on the voltage shift amount.

25. The method of claim 24, wherein adjusting the supply voltage comprises increasing the supply voltage by an amount associated with the voltage shift amount, and wherein the corrective action is applied to each of the SRAM cells of the array of SRAM cells.

26. The method of claim 24, further comprising:
detecting a second power-up operation subsequent to the supply voltage being adjusted;
determining a second number of the SRAM cells of the array having the particular initial state responsive to the second power-up operation;
comparing the second number of the SRAM cells to a second threshold;
in response to the second number of the SRAM cells being greater than or equal to the second threshold, determining a second voltage shift amount; and
increasing the supply voltage by a second amount associated with the second voltage shift amount.

27. An apparatus comprising:
a static random-access memory (SRAM) including an on-chip sensor, wherein each SRAM cell of the on-chip sensor is configured to be initialized to a corresponding initial state based on a supply voltage received during a power-up operation of the SRAM;
a controller configured to determine an estimated amount of voltage shift of a transistor threshold voltage based on a number of the SRAM cells of the on-chip sensor that, responsive to the power-up operation, have a particular initial state, wherein the corresponding initial state of each SRAM cell comprises a "01" state or a "10" state, and wherein the particular initial state comprises the "01" state; and
a circuit configured to adjust a supply voltage provided to the SRAM based on the estimated amount of voltage shift.

28. The apparatus of claim 27, wherein the circuit includes a power management integrated circuit (PMIC) configured to provide the supply voltage to the SRAM responsive to the power-up operation.

29. The apparatus of claim 28, wherein the controller is configured to generate an output signal based on the estimated amount of voltage shift, and wherein the PMIC is configured to adjust the supply voltage responsive to the output signal.

30. The apparatus of claim 27, wherein the controller is further configured to refrain from programing the SRAM cells to the initial state prior to determining the number of the SRAM cells having the particular initial state, and wherein the initial state corresponds to an unwritten state.

* * * * *